United States Patent
Sakimura et al.

(10) Patent No.: US 7,885,095 B2
(45) Date of Patent: Feb. 8, 2011

(54) MAGNETIC RANDOM ACCESS MEMORY AND OPERATION METHOD OF THE SAME

(75) Inventors: Noboru Sakimura, Tokyo (JP); Takeshi Honda, Tokyo (JP); Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 171 days.

(21) Appl. No.: 12/303,821

(22) PCT Filed: Jun. 1, 2007

(86) PCT No.: PCT/JP2007/061189

§ 371 (c)(1),
(2), (4) Date: Feb. 9, 2009

(87) PCT Pub. No.: WO2007/142138

PCT Pub. Date: Dec. 13, 2007

(65) Prior Publication Data

US 2010/0046283 A1    Feb. 25, 2010

(30) Foreign Application Priority Data

Jun. 8, 2006    (JP) ............................. 2006-159353

(51) Int. Cl.
G11C 11/00    (2006.01)
C11C 11/14    (2006.01)

(52) U.S. Cl. ...................................... 365/158; 365/171

(58) Field of Classification Search ................. 365/158, 365/171, 173
See application file for complete search history.

(56) References Cited

U.S. PATENT DOCUMENTS

| | | | |
|---|---|---|---|
| 6,804,144 B2 | 10/2004 | Iwata | |
| 6,839,272 B2 | 1/2005 | Ooishi | |
| 6,914,808 B2 | 7/2005 | Inaba | |
| 7,245,522 B2 * | 7/2007 | Aoki | ............................ 365/158 |
| 7,272,034 B1 * | 9/2007 | Chen et al. | ................... 365/158 |
| 2002/0006058 A1 | 1/2002 | Nakajima et al. | |
| 2004/0100835 A1 | 5/2004 | Sugibayashi et al. | |
| 2004/0141368 A1 | 7/2004 | Inaba | |

(Continued)

FOREIGN PATENT DOCUMENTS

JP    2001-236781 A    8/2001

(Continued)

*Primary Examiner*—Anh Phung
(74) *Attorney, Agent, or Firm*—Sughrue Mion, PLLC

(57) ABSTRACT

A magnetic random access memory of the present invention includes: a plurality of first wirings and a plurality of second wirings extending in a first direction; a plurality of third wirings and a plurality of fourth wirings extending in a second direction; and a plurality of memory cells provided at intersections of the plurality of first wirings and the plurality of third wirings, respectively. Each of the plurality of memory cells includes: a first transistor and a second transistor connected in series between one of the plurality of first wirings and one of the plurality of second wirings and controlled in response to a signal on one of the plurality of third wirings, a first magnetic resistance element having one end connected to a write wiring through which the first transistor and the second transistor are connected, and the other end grounded; and a second magnetic resistance element having one end connected to the write wiring, and the other end connected to the fourth wiring.

11 Claims, 11 Drawing Sheets

U.S. PATENT DOCUMENTS

| | | |
|---|---|---|
| 2005/0236177 A1 | 10/2005 | Inagaki et al. |
| 2007/0171704 A1 | 7/2007 | Hung et al. |

FOREIGN PATENT DOCUMENTS

| | | |
|---|---|---|
| JP | 2002-269968 A | 9/2002 |
| JP | 2003-249072 A | 9/2003 |
| JP | 2004-145952 A | 5/2004 |
| JP | 2004-206796 A | 7/2004 |
| JP | 2004-213771 A | 7/2004 |
| JP | 2004-220759 A | 8/2004 |
| JP | 2004-348934 A | 12/2004 |
| JP | 2005-182986 A | 7/2005 |
| JP | 2005-236177 A | 9/2005 |

* cited by examiner

MAGNETIC RANDOM ACCESS MEMORY AND OPERATION METHOD OF THE SAME

TECHNICAL FIELD

This application is based on Japanese Patent Application (2006-159353) filed on Jun. 8, 2006 and claims the benefit of the priority right based on the Japanese patent application. The entire disclosure of the Japanese patent application is incorporated herein by reference.

The present invention relates to a magnetic random access memory (MRAM) in which a magnetic tunnel junction (MTJ) is used in a memory cell as a memory element.

BACKGROUND ART

An MTJ element used in a memory cell of an MRAM includes a pinned magnetic layer whose magnetization is pinned in an optional direction, and a free magnetic layer whose magnetization is variable by an external magnetic field. The pinned magnetic layer and the free magnetic layer are laminated such that a tunnel insulating film is put between them. In the MRAM, a 1-bit storage data is assigned to the relative magnetization state between the pinned magnetic layer and the free magnetic layer. For example, when the magnetizations of the pinned magnetic layer and the free magnetic layer are equal in direction, namely, parallel, the data is defined as "0". When the magnetizations of the pinned magnetic layer and the free magnetic layer are different from each other by 180 degrees, namely, anti-parallel, the data is defined as "1". A read operation of the MRAM is performed by using that the MTJ resistance is different depending on the magnetization state.

In order to read the MTJ resistance, it is general to apply a predetermined voltage to the MTJ element and read a sensing current (a current sensing method). However, a ratio of an MTJ resistance Rj0 in case of "0" and an MTJ resistance Rj1 in case of "1", namely, an MR ratio is 30% to 50% at most. Thus, a read signal is not too great. In a typical MRAM, a reference cell having a middle resistance between Rj0 and Rj1 is arranged inside a memory array, and the read operation is performed. In this case, a substantial read signal is ½ of the MR ratio. Therefore, such a low MR ratio is insufficient to perform a high speed read operation of several ns. Moreover, in the current sensing method, there is a drawback that a long time is required to carry out a current-voltage conversion and that the sensing amplifier becomes large in size.

As its countermeasure, the MRAM in which the MTJ resistance is read by using a voltage is disclosed in Japanese Patent Application Disclosure (JP-P2004-220759A (hereafter, to be referred to as ['759 Application]). FIGS. 1 and 2 show a part of a configuration of the MRAM disclosed in the '759 application. FIG. 1 mainly shows a write operation, and FIG. 2 mainly shows a read operation. Here, the MRAM contains a plurality of memory cells 102, a plurality of first bit lines (/WBL) 104, a plurality of second bit lines (WBL) 105, a plurality of third bit lines (RBL) 110, a plurality of first word lines (WWL) 103a, a plurality of second word lines (RWL) 103b, a write circuit 109 and a sense amplifier 108. It should be noted that on the drawings in this Description, the MTJ elements are shown by the symbols of variable resistors.

The first word line 103a and the second word line 103b constitute a word line set and extend in an X-direction. The first bit line 104, the second bit line 105 and the third bit line 110 constitute a bit line set and extend in a Y-direction. In the first bit line 104 and the second bit line 105, their one ends are connected to the write circuit 109. In the third bit line 110, one end is connected to the sense amplifier 108. The plurality of memory cells 102 are arranged in a matrix. The plurality of memory cells 102 are arranged the intersections between the plurality of word line sets and a plurality of bit line sets. The write circuit 109 sends complementary write currents Iy and /Iy to the first bit line 104 and the second bit line 105 of a selection bit line set selected from the plurality of bit line sets based on an address signal, in a direction determined based on a write data Din, at the time of the write operation. The sense amplifier 108 compares a voltage of the third bit line 110 and a reference voltage (Vdd/2) at the time of the read operation, and outputs the comparison result as a read data Qout.

The memory cell 102 contains an MTJ element J0, a transistor M0, a transistor M1 and an MTJ element J1. The MTJ element J0, the transistor M0, the transistor M1 and the MTJ element J1 are connected in series between the first bit line 104 and the second bit line 105 in this order. The third bit line is connected to a node N1 in the middle point between the transistor M0 and the transistor M1. The transistors M0 and M1 are controlled to be turned on/off in response to a signal on the second word line 103b. The MTJ element J0 is arranged near the point at which the first bit line 104 and the first word line 103a intersect. The MTJ element J1 is arranged near the point at which the second bit line 105 and the first word line 103a intersect.

With reference to FIG. 1, in this memory cell 102, the complementary data are written into the two MTJ elements J0 and J1 connected in series. That is, in the write operation of the memory cell 102, a write current Ix is firstly sent into the first word line 103a. Moreover, the write current /Iy is sent into the first bit line 104, and the write current Iy is sent into the second bit line 105, complementarily. Here, the write current Iy and the write current /Iy always flow in the directions opposite to each other. By those write currents, the complementary data are written to the MTJ element J0 and the MTJ element J1. That is, any one state of "0" and "1" is written to the MTJ element J0, and any one state between "1" and "0" is written to the MTJ element J1.

With reference to FIG. 2, in the read operation of the memory cell 102, the second word line 103b is firstly activated to turn on the transistors M0 and M1. Then, a power supply voltage (Vdd) is applied to the second bit line 105, and a ground voltage (Gnd) is applied to the first bit line 104. Thus, a read current $I_R$ flows through the MTJ element J0 and the MTJ element J1 that are connected in series. At this time, a sense voltage Vs as a voltage at a node N1 is outputted to the third bit line 110. The sense voltage Vs has any one of the higher voltage and the lower voltage than Vdd/2 in accordance with the storage states of the MTJ elements J0 and J1. For example, when the MTJ element J0 is "0" (in the low resistance state) and the MTJ element J1 is "1" (in the high resistance state), Vs<Vdd/2. On the other hand, when the MTJ element J0 is "1" and the MTJ element J1 is "0", Vs>Vdd/2. The merit of this memory cell 102 lies in that, since the two MTJ elements for storing the complementary data are used to carry out the read operation, the read signal is great. Moreover, since the read signal is based on a voltage (a voltage sensing method), as the sense amplifier for amplifying the signal, it is possible to use the circuit similar to the conventional DRAM. Thus, the small circuit can be used to carry out the amplification at a high speed.

However, not only in the MRAM cell noted in the '759 application but also in the typical MRAM cell, a data is written into a selection memory cell by use of a synthetic magnetic field generated based on the write current Ix and the write current Iy whose current directions are orthogonal to each other. Thus, if the current values of the write currents Ix and Iy are small, the write operation cannot be performed. Oppositely, if the current values are large, the data is erroneously written into non-selected memory cells. Thus, in order to selectively perform the write operation, the current value and the current waveform are required to be accurately controlled. Therefore, it is not easy to perform the high speed write operation.

On the other hand, the memory cell (2-Transistor—1-MTJ Memory Cell: 2T1MTJ Cell) that allows a write margin of the MRAM to be dramatically improved is disclosed in Japanese Patent Application Publication (JP-P2004-348934A) (hereinafter, to be referred to as ['934 Application]). FIGS. 3 and 4 are diagrams showing a part of the configuration of the MRAM disclosed in the '934 application. FIG. 3 mainly shows the write operation, and FIG. 4 mainly shows the read operation. Here, the MRAM contains a plurality of memory cells 202, a plurality of first bit lines (/WBL) 204, a plurality of second bit lines (WBL) 205, a plurality of third bit lines (RBL) 210, a plurality of word lines (WL) 203, a write circuit 209 and a sense amplifier 208.

The word line 203 extends in the X-direction. The first bit line 204, the second bit line 205 and the third bit line 210 constitute the bit line set and extend in the Y-direction. In the second bit line 204 and the second bit line 205, their one ends are connected to the write circuit 209. In the third bit line 210, one end is connected to the sense amplifier 208. The plurality of memory cells 202 are arranged in a matrix. The plurality of memory cells 202 are provided at the intersections of the plurality of word lines 203 and the plurality of bit line sets. The write circuit 209 sends a write current Iw to a route of the first bit line 204—the selection cell 202—the second bit line 205, in a selection bit line set selected from the plurality of bit line sets in accordance with the address signal, in a direction corresponding to the write data Din, at the time of the write operation. However, the selection memory cell 202 is selected from the plurality of memory cells 202 based on the selection bit line set and the selection word line 203 selected from the plurality of word lines 203. The sense amplifier 208 compares a read current $I_R$ flowing through the third bit line 110 and a reference current flowing through a reference bit line RBLR at the time of the read operation, and outputs the comparison result as the read data Qout.

The memory cell 202 includes a first transistor 206, a second transistor 216 and an MTJ element 207 (2T1MTJ), In the first transistor 206, its gate is connected to the word line 203, and one terminal is connected to the first bit line 204. In the second transistor 216, its gate is connected to the word line 203, one terminal is connected to the other terminal of the first transistor 206, and the other terminal is connected to the second bit line 205. That is, the first transistor 206 and the second transistor 216 are connected in series between the first bit line 204 and the second bit line 205. In the MTJ element 207, one terminal is connected to the connection point between the first transistor 206 and the second transistor 216, and the other terminal is connected to the third bit line 210.

With reference to FIG. 3, in the write operation of the memory cell 202, a decoder (not shown) selects and activates the selection word line 3 from the plurality of word lines 3, and turns on the first transistor 206 and the second transistor 216. Then, the write circuit 209 sets one of the second bit line 205 and the first bit line 204 to the power supply voltage (Vdd) and sets the other to the ground voltage (Gnd), in accordance with the write data Din. Thus, the write current Iw flows in one direction of the two directions through the write wiring serving as a connection point between the first transistor 206, the second transistor 216 and the MTJ element 207, and the write operation is performed. For example, in FIG. 3, the second bit line 205 is set to the power supply voltage, and the first bit line 204 is set to the ground voltage. Therefore, the write current Iw flows in the direction from the second bit line 205 to the first bit line 204.

With reference to FIG. 4, in the read operation of the memory cell 202, the word line 203 is activated to turn on the first transistor 206 and the second transistor 216. Then, both of the second bit line 205 and the first bit line 204 are grounded. Thus, the read current Iw flows from the sense amplifier 208 through the MTJ element 207 in the memory cell 202. The sense amplifier 208 compares the read current Iw and the reference current and outputs the comparison result as the read data Qout.

The merit of the memory cell 202 lies in that the selection property of the memory cell 202 in the write operation is dramatically improved and the write operation margin is wide. Thus, the accurate control of the current value of the write current becomes unnecessary, which makes the write circuit simple and further makes the high speed write operation easy.

In the MRAM described in Japanese Patent Application Publication (JP-P2004-220759A), the series connection terminal voltage of the two MTJ elements J0 and J1 in which the complementary data are stored is read, so that the high speed read operation can be expected. However, the write operation is similar to the conventional MRAM. In particular, the write margin is narrow. Thus, the write current Iw must be accurately controlled. In short, the operational speed of the write operation is not improved. Also, in order to write the complementary data to the two MTJ elements J0 and J1, a device on the circuit is required.

On the other hand, in the MRAM described in Japanese Patent Application Publication (JP-P2004-348934A), the write current Iw is sent into the selection memory cell 202 by the transistors 206 and 216 provided inside the memory cell 202. Therefore, the operational margin is wide. Thus, the write current Iw is not required to be accurately controlled, which can attain the high speed write operation. However, since the read method similar to the conventional MRAM is performed, the margin of the read operation (the read signal) is not improved. In short, the operational speed of the read operation is not improved.

In relation to this application, Japanese Patent Application Publication (JP-P2003-249072A) discloses an MRAM having the structure in which a plurality of MTJ elements connected in series are stacked in a direction vertical to a substrate. According to such a structure, the MTJ elements can be integrated at a high density.

Also, Japanese Patent Application Publication (JP-P2005-236177A) discloses a technique for mirror-symmetrically arranging the memory arrays with respect to the axis parallel to the magnetization difficulty axis of the memory cell. According to such an arrangement, a relation between the direction of the write current flowing through the bit line and the write data is same over all of the memory cells. Thus, it is possible to keep the uniformity between the write data and the read data.

Moreover, Japanese Patent Application Publication (JP-P2004-145952A) discloses an MRAM that contains a main word line, a sub word line, a main bit line and a sub bit line. In the MRAM, an MRAM cell including an MTJ element is arranged at an intersection of the sub word line and the sub bit line. A selection transistor for selecting the sub word line is arranged on the downward side of the write current as compared with the MRAM cell and directly connected to the main word line and the sub bit line. The selection transistor is driven to involve a snack-back phenomenon. The write operation into the memory cell is performed by a substrate current of the selection transistor. According to such a configuration, the write current is not limited by the channel current of the selection transistor. In the MRAM, the substrate current is used to send the write current. Thus, the great write current can be sent through the selection transistor of the small size, thereby making the area of the memory array small.

DISCLOSURE OF INVENTION

It is therefore an object of the present invention to provide an MRAM and its operation method, in which both of a write margin and a read margin can be improved, to allow a high speed operation.

In an aspect of the present invention, a magnetic random access memory includes: a plurality of first wirings and a plurality of second wirings, a plurality of third wirings and a plurality of fourth wirings, and a plurality of memory cells. The plurality of first wirings and the plurality of second wirings extend in a first direction. The plurality of third wirings and the plurality of fourth wirings extend in a second direction. The plurality of memory cells are provided at intersections between the plurality of first wirings and the plurality of third wirings, respectively. Each of the plurality of memory cells includes a first transistor, a second transistor, a first magnetic resistance element and a second magnetic resistance element. The first transistor and the second transistor are connected in series between the first wiring and the second wiring and controlled in response to a signal on the third wiring. In the first magnetic resistance element, one end is connected to a write wiring through which the first transistor and the second transistor are connected, and the other end is grounded. In the second magnetic resistance element, one end is connected to the write wiring, and the other end is connected to the fourth wiring.

According to the present invention, in the MRAM, both of the write margin and the read margin can be improved, to allow a high speed operation.

BEST MODE FOR CARRYING OUT THE INVENTION

Figure 1:
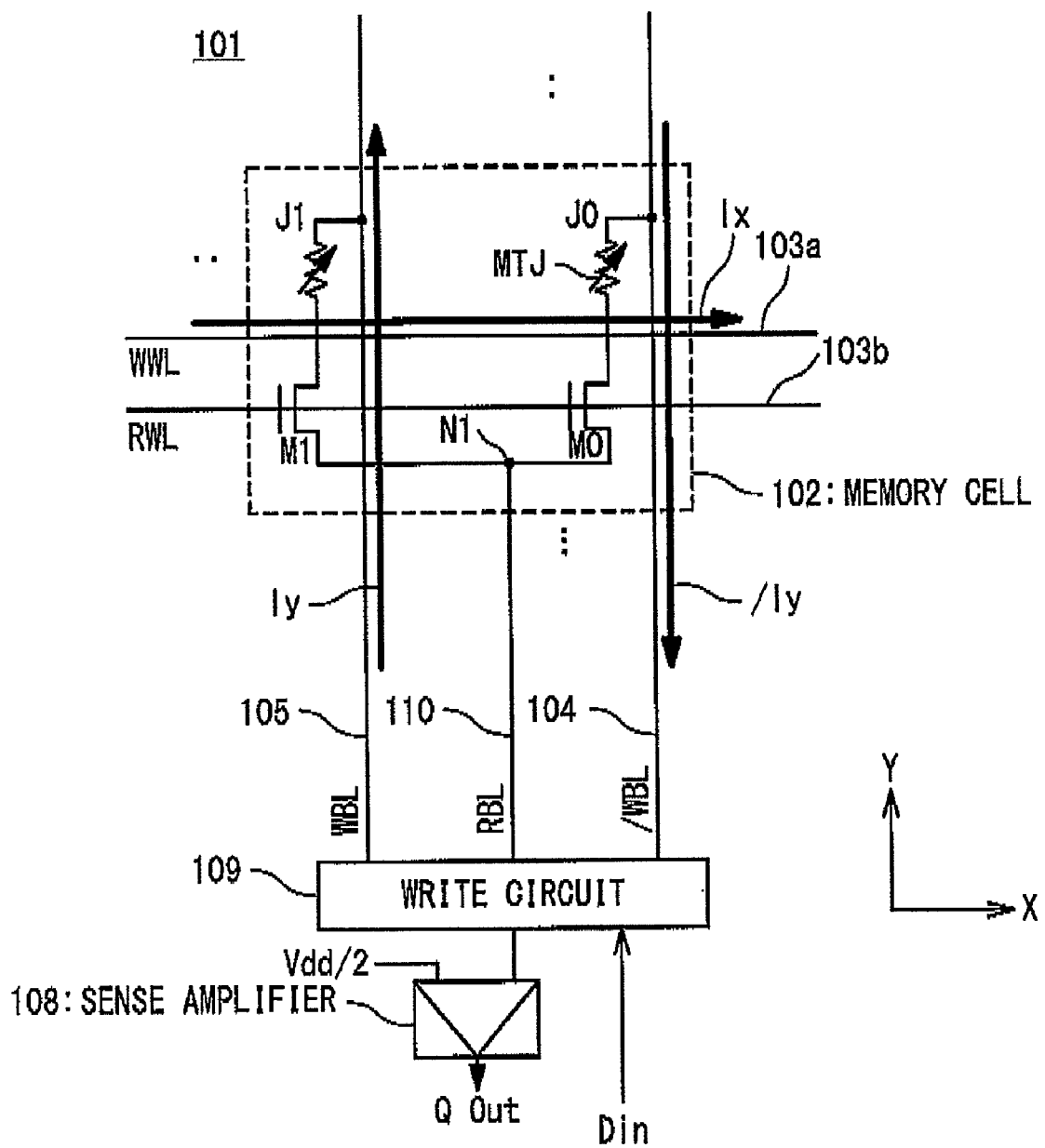
FIG. 1 is a diagram showing a part of a configuration of an MRAM disclosed in a '759 application.
Figure 2:
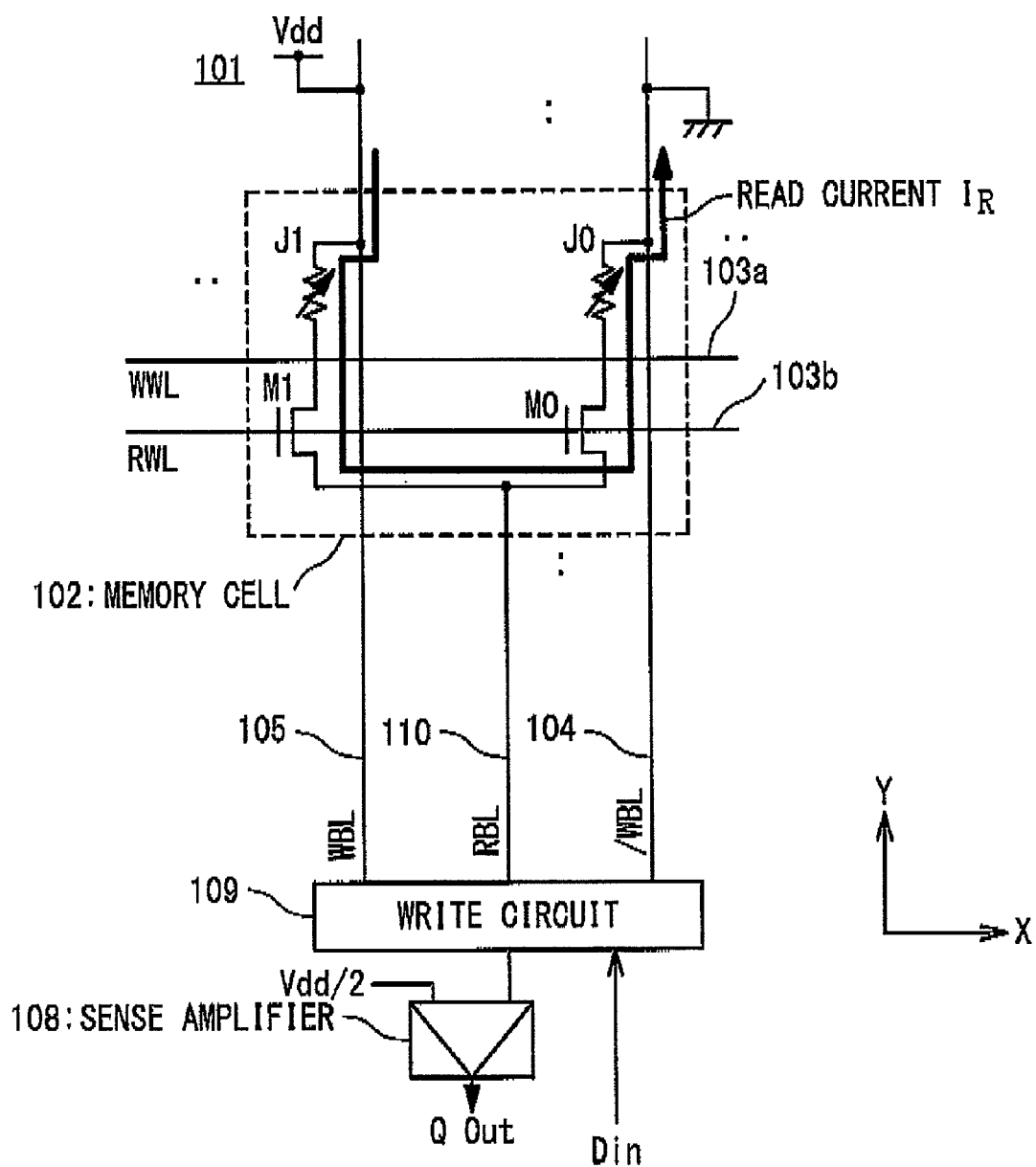
FIG. 2 is a diagram showing a part of the configuration of the MRAM disclosed in the '759 application.
Figure 3:
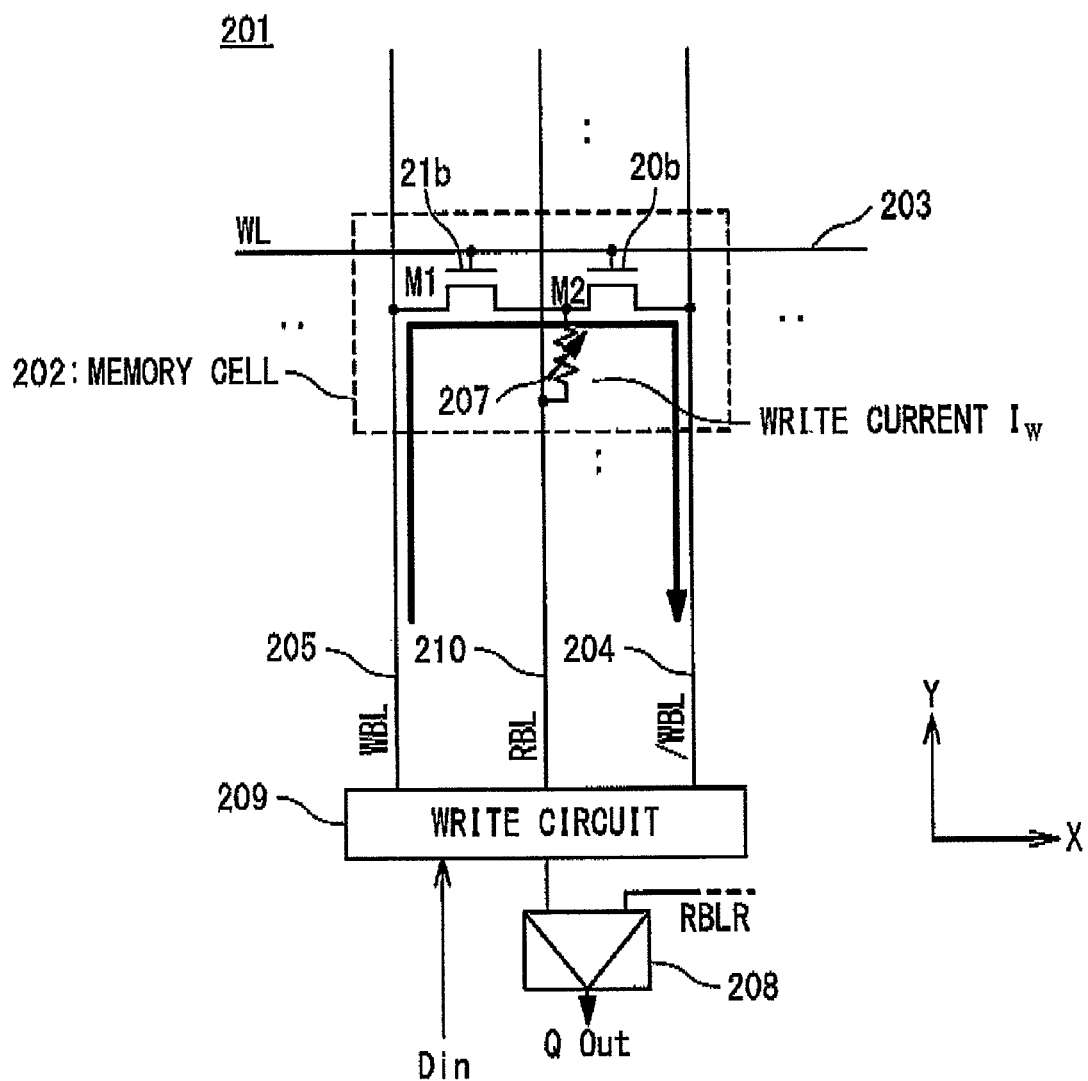
FIG. 3 is a diagram showing a part of a configuration of an MRAM disclosed in '934 application.
Figure 4:
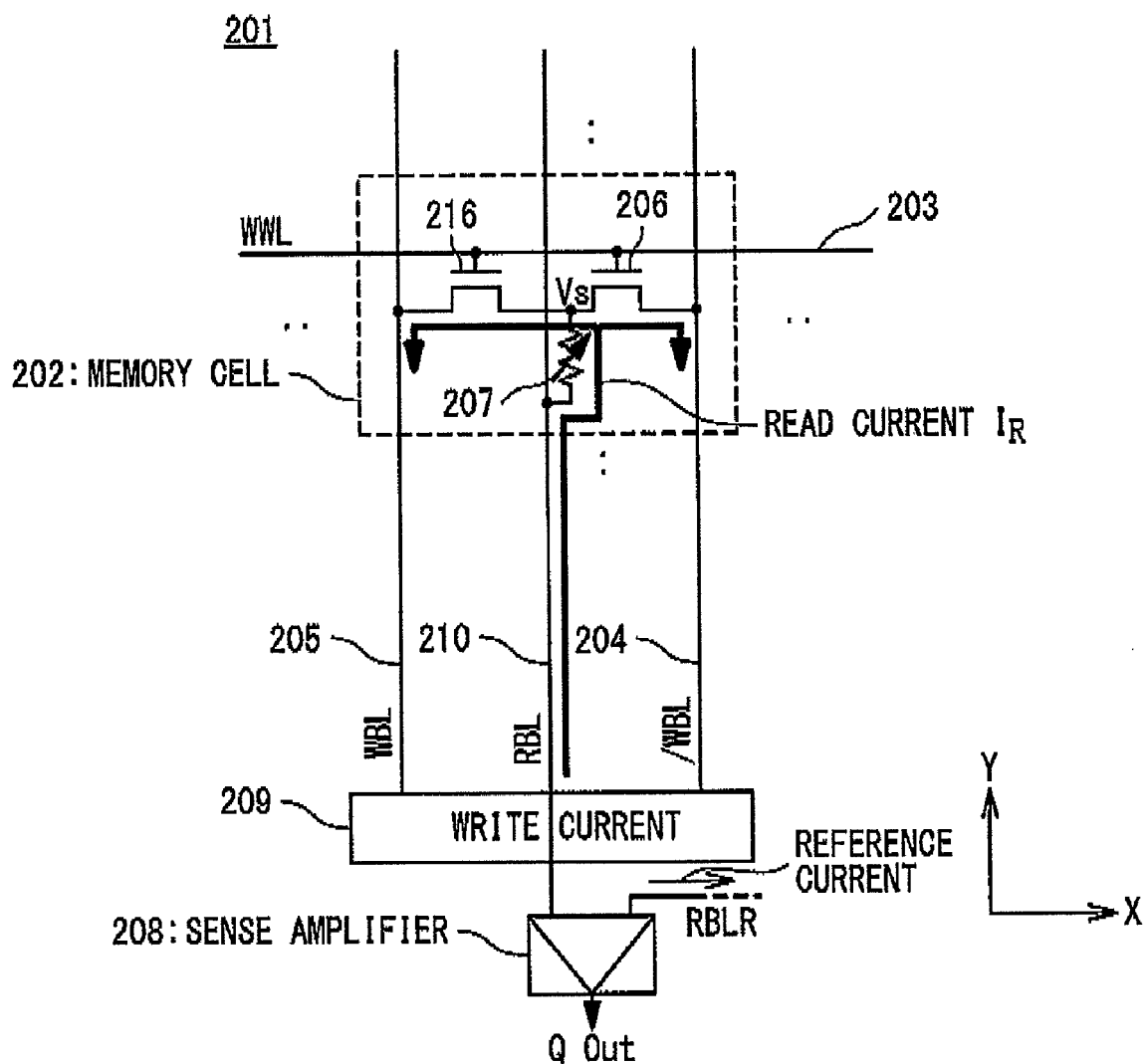
FIG. 4 is a diagram showing a part of the configuration of the MRAM disclosed in the '934 application.

Hereinafter, a magnetic random access memory (MRAM) and its operation method according to exemplary embodiments of the present invention will be described. In one exemplary embodiment of the present invention, the magnetic random access memory (MRAM) contains a plurality of first wirings and a plurality of second wirings, a plurality of third wirings and a plurality of fourth wirings, and a plurality of memory cells. The plurality of first wirings and the plurality of second wirings extend in a first direction. The plurality of third wirings and the plurality of fourth wirings extend in a second direction. The plurality of memory cells are provided at intersections of the plurality of first wirings and the plurality of third wirings, respectively. Each of the plurality of memory cells includes a first transistor, a second transistor, a first magnetic resistance element and a second magnetic resistance element. The first transistor and the second transistor are connected in series between the first wiring and the second wiring and controlled in response to a signal on the third wiring. In the first magnetic resistance element, one end is connected to the write wiring through which the first transistor and the second transistor are connected, and the other end is grounded. In the second magnetic resistance element, one end is connected to the write wiring, and the other end is connected to the fourth wiring.

The magnetic random access memory may further contain a plurality of fifth wirings extending in the first direction and a plurality of sixth wirings extending in the second direction. Each of the plurality of memory cells includes a third transistor connected between the write wiring and the fifth wiring and controlled in response to a signal on the sixth wiring.

In the magnetic random access memory, in two memory cells adjacent to each other among the plurality of memory cells, it is preferred that the write wirings are mirror-symmetrically arranged. Also, in the two memory cells adjacent to each other, it is further preferred that the write wirings are mirror-symmetrically arranged, and the magnetic resistance elements are parallel-symmetrically arranged.

In the magnetic random access memory, it is preferable that different data are written into the first magnetic resistance element and the second magnetic resistance element in each of the plurality of memory cells based on a write current flowing through the write wirings.

In the preferable exemplary embodiment, a node at which the first wiring and the first transistor are connected is physically shared by two adjacent to each other among the plurality of memory cells, and a node at which the second wiring and the second transistor are connected is physically shared by the two memory cells adjacent to each other.

In the preferable exemplary embodiment, in one memory cell in the two memory cells adjacent to each other among the plurality of memory cells, the first magnetic resistance element is arranged on the first wiring side, and the second magnetic resistance element is arranged on the second wiring side, and in the other memory cell, the first magnetic resistance element is arranged on the second wiring side, and the second magnetic resistance element is arranged on the first wiring side.

In the magnetic random access memory, the write wiring is preferred to be substantially U-shaped.

In one exemplary embodiment of the present invention, an operation method of the magnetic random access memory is provided which includes: a plurality of first wirings and a plurality of second wirings, which extend in a first direction; a plurality of third wirings and a plurality of fourth wirings, which extend in a second direction; and a plurality of memory cells provided at intersections between the plurality of first wirings and the plurality of third wirings, respectively, and each of the plurality of memory cells includes: a first transistor and a second transistor which are connected in series between the first wiring and the second wiring and controlled in response to a signal on the third wiring; a first magnetic resistance element in which one end is connected to a write wiring for connecting the first transistor and the second transistor and the other end is grounded; and a second magnetic resistance element in which one end is connected to the write wiring, and the other end is connected to the fourth wiring. At the time of a read operation from the memory cell, the operating method includes: (A) setting the fourth wiring to a first voltage higher than a ground voltage; and (B) outputting a read data based on a comparison result between a voltage of the write wiring and ½ of the first voltage as a reference voltage.

In the preferable exemplary embodiment, the (B) includes: (B1) selecting the third wiring and turning on the first transistor and the second transistor; and (B2) obtaining the voltage of the write wiring from one of the first wiring and the second wiring.

When the magnetic random access memory further includes a plurality of fifth wirings extending in the first direction and a plurality of sixth wirings extending in the second direction, and each of the plurality of memory cells includes a third transistor connected between the write wiring and the fifth wiring and controlled in response to a signal on the sixth wiring, it is preferable that the (B) includes: (B1) selecting the sixth wiring and turning on the third transistor; and (B2) obtaining the voltage of the write wiring from the fifth wiring.

Figure 5:
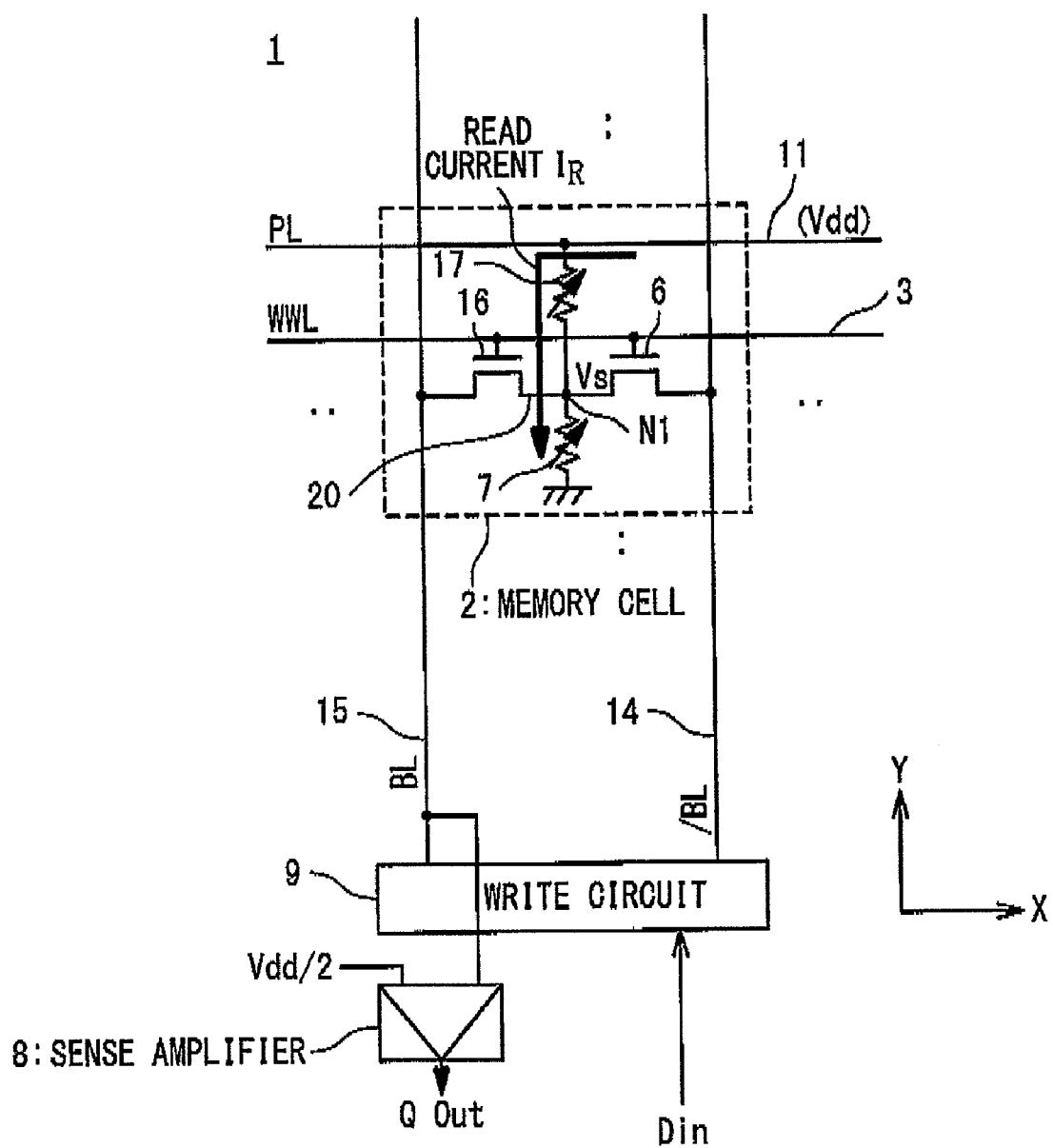
FIG. 5 is a circuit block diagram showing the configuration of an MRAM according to an exemplary embodiment of the present invention.

The MRAM and its operation method according to the exemplary embodiments of the present invention will be described specifically with reference to the attached drawings. FIG. 5 is a circuit block diagram showing the configuration of the MRAM according to an exemplary embodiment of the present invention. A MRAM 1 contains a plurality of memory cells 2, a plurality of first bit lines (/BL) 14, a plurality of second bit lines (BL) 15, a plurality of word lines (WL) 3, a plurality of plate lines (PL) 11, a write circuit 9 and a sense amplifier 8.

The word line 3 and the plate line 11 constitute a word line set and extend in the X-direction. The one ends of the word line 3 and the plate line 11 are connected to a decoder (not shown). The first bit line 14 and the second bit line 15 constitute a bit line set and extend in the Y-direction. One ends of the first bit line 14 and the second bit line 15 are connected to the write circuit 9. The second bit line 15 is also connected to a sense amplifier 8.

The plurality of memory cells 2 are arranged in a matrix. The plurality of memory cells 2 is provided at intersections of the plurality of word line sets and the plurality of bit line sets. The write circuit 9 sends a write current Iw in a direction determined based on the write data Din, through a route of the first bit line 14—a selection cell 2—the second bit line 15, in the selection bit line set selected from the plurality of bit line sets based on an address signal, at the time of a write operation. Here, the selection cell 2 is the memory cell 2 selected from among the plurality of memory cells 2 by the selection bit line set and a selection word line 3 which is selected from the plurality of word lines 3. The sense amplifier 8 compares a voltage of the second bit line 15 and a reference voltage Vdd/2 at the time of a read operation, and outputs the comparison result as the read data Qout.

The memory cell 2 contains a first transistor 6, a second transistor 16, a first MTJ element 7 and a second MTJ element 17. That is, the memory cell 2 is the 2T2MTJ cell (2-Transistor—2-MTJ memory cell). In the first transistor 6, its gate is connected to the word line 3, one terminal is connected to the first bit line 14, and the other terminal is connected to the node N1. In the second transistor 16, its gate is connected to the word line 3, one terminal is connected to the node N1, and the other terminal is connected to the second bit line 15. That is, the first transistor 6 and the second transistor 16 are connected in series between the first bit line 14 and the second bit line 15. Since a current flows through a write wiring 20 as a wiring through which the first transistor 6 and the second transistor 16 are connected, a data is written to the first MTJ element 7 and the second MTJ element 17. In the first MTJ element 7, one terminal is connected to the node N1 (the write wiring 20 between the first transistor 6 and the second transistor 16), and the other terminal is connected to a ground wiring. In the second MTJ element 17, one terminal is connected to the node N1, and the other terminal is connected to the plate line 11.

The write operation of the memory cell 2 will be described below. At first, the decoder (not shown) grounds or opens the plate line 11. Then, the decoder selects and activates the selection word line 3 from the plurality of word lines 3 based on the address signal. Thus, the first transistor 6 and the second transistor 16 having the gates connected to the selection word line 3 are turned on. On the other hand, the write circuit 9 selects the selection bit line set from the plurality of bit line sets based on the address signal. Thus, the selection cell 2 is selected from among the plurality of memory cells 2 by the selection word line 3 and the selection bit line set. Then, the write circuit 9 sets one of the second bit line 15 and first bit line 14 among the selection bit line set to the power supply voltage (Vdd) and the other to the ground voltage (Gnd) in accordance with a write data Din. Thus, the write current Iw flows in one direction determined based on the write data Din in the two directions in the write wiring 20 between the first transistor 6 and the second transistor 16 in the selection cell 2. Thus, a write magnetic field is generated around the write wiring 20 by the write current Iw. At this time, since the first MTJ element 7 and the second MTJ element 17 in the selection cell 2 are located near the write wiring 20, the write data Din is written by the write magnetic field.

In the memory cell 2, a circuit is devised in such a manner that the write current Iw flows through only the selection cell 2. Thus, a margin of the write operation to the selection cell 2 can be made wide. Therefore, the write circuit is simplified to allow the write operation of the higher speed.

Figure 6:
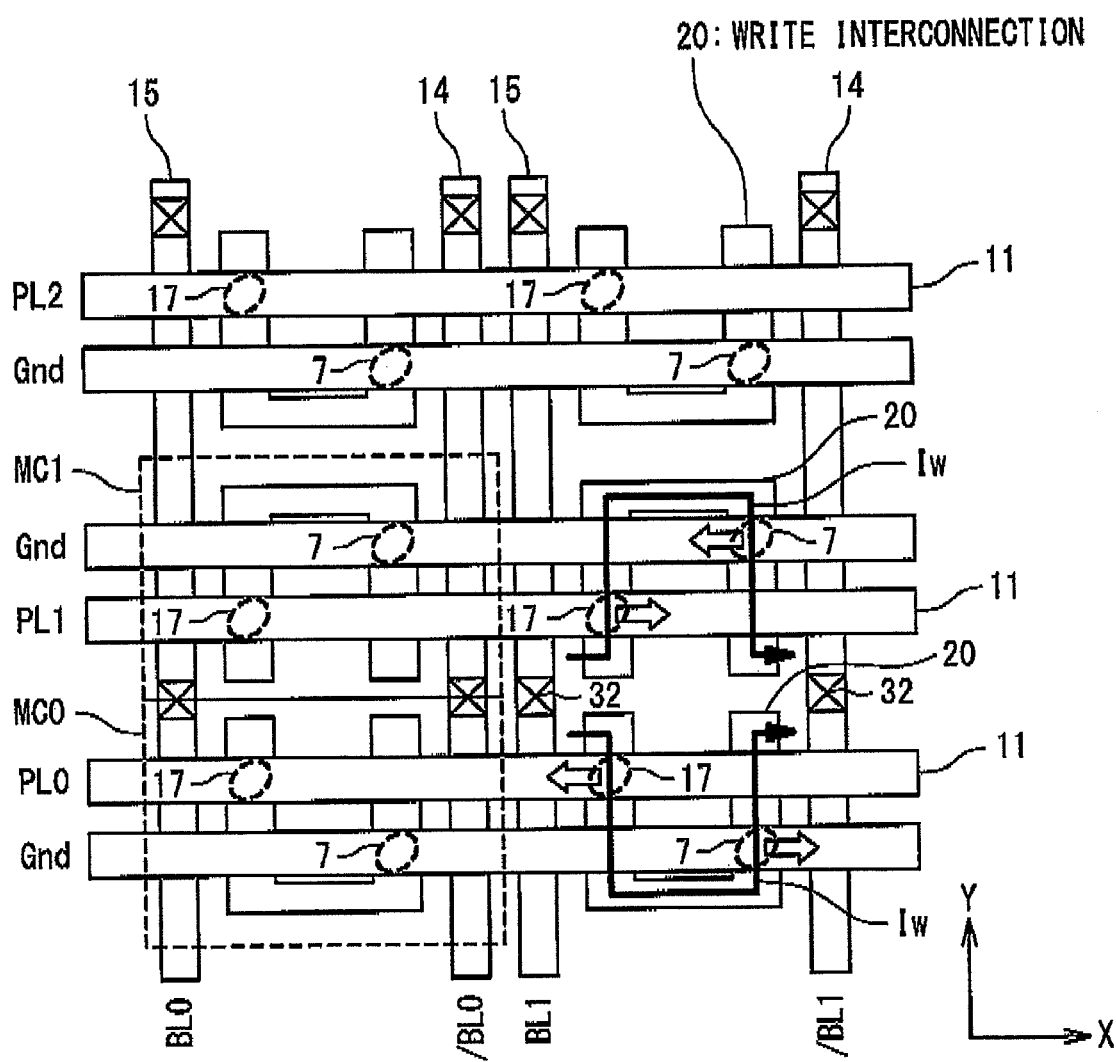
FIG. 6 is a plan view showing one example of a layout of a memory cells in FIG. 5.

In the memory cell 2, in order to write the complementary data to the first MTJ element 7 and the second MTJ element 17 based on the input write data Din, a layout of the write wiring 20 is devised as follows. FIG. 6 is a plan view showing one example of the layout of the memory cell shown in FIG. 5. In order to easily check the drawing, only the plurality of first bit lines 14 (/BL0, /BL1, . . . ), the plurality of second bit lines 15 (BL0, BL1, . . . ), the write wiring 20 (the wiring through which the first transistor 6 and the second transistor 16 are connected), the plurality of plate lines 11 (PL0, PL1, PL2, . . . ), the ground wiring (Gnd), the first MTJ element 7 and the second MTJ element 17 are drawn. The directions of the white arrows, which are shown on the first MTJ element 7 and the second MTJ element 17, indicate the directions of the magnetic field, which are generated by the write current Iw and applied to the free magnetic layers. As shown in FIG. 6, in this example, the first MTJ element 7 and the second MTJ element 17 are laminated straightly on the layer of the write wiring 20. In order to write the complementary data to the two first MTJ element 7 and second MTJ element 17, the layout is devised and designed such that the write wiring 20 is substantially U-shaped, and the magnetization inversion magnetic fields resulting from the write current Iw applied to the respective MTJ elements are opposite to each other.

The read operation from this memory cell 2 will be described below. At first, the decoder (not shown) selects a selection plate line 11 from the plurality of plate lines 11 and applies the power supply voltage (Vdd) to the selection plate line 11. Then, the decoder selects and activates the selection word line 3 from the plurality of word lines 3 based on the address signal. Thus, the first transistor 6 and the second transistor 16, which are connected to the selection word line 3, are turned on. At this time, a read current $I_R$ flows through a route of the plate line 11—the second MTJ element 17—the first MTJ element 7—the ground. As a result, the sense voltage Vs is generated at the node N1, at which the second MTJ element 17 and the first MTJ element 7 are connected, namely, on the write wiring 20. Here, since the second transistor 16 is turned on, the sense voltage Vs is outputted to the second bit line 15. The sense voltage Vs becomes the voltage higher or lower than Vdd/2 in accordance with the data stored in the second MTJ element 17 and the first MTJ element 7. For example, when the first MTJ element 7 stores "0" and the second MTJ element 17 stores "1" (the first MTJ element 7 is in the low resistance state and the second MTJ element 17 is in the high resistance state), the sense voltage Vs<Vdd/2. Oppositely, when the first MTJ element 7 stores "1" and the second MTJ element 17 stores "0" (the first MTJ element 7 is in the high resistance state and the second MTJ element 17 is in the low resistance state), the sense voltage Vs>Vdd/2. The sense amplifier 8 connected to the second bit line 15 compares the sense voltage Vs and the reference voltage (Vdd/2) and reads the stored data. Here, in order for the read current $I_R$ to easily flow through only a route of the second MTJ element 17 and the first MTJ element 7, a circuit in which the input impedance of the sense amplifier 8 is high is preferable.

In this way, the read operation is carried out by using the two MTJ elements (the second MTJ element 17 and the first MTJ element 7) of the memory cell 2 to store the complementary data. Thus, the read signal can be made large. That is, a read margin can be made large. Moreover, since the read signal is voltage-based (a voltage sensing method), the sense amplifier for amplifying the signal can be miniaturized, and the read operation can be performed at the high speed.

As mentioned above, in the memory cell according to the present invention and the MRAM that uses the same, it is possible to improve both of the write margin and the read margin and make the operational speed higher.

Figure 7:
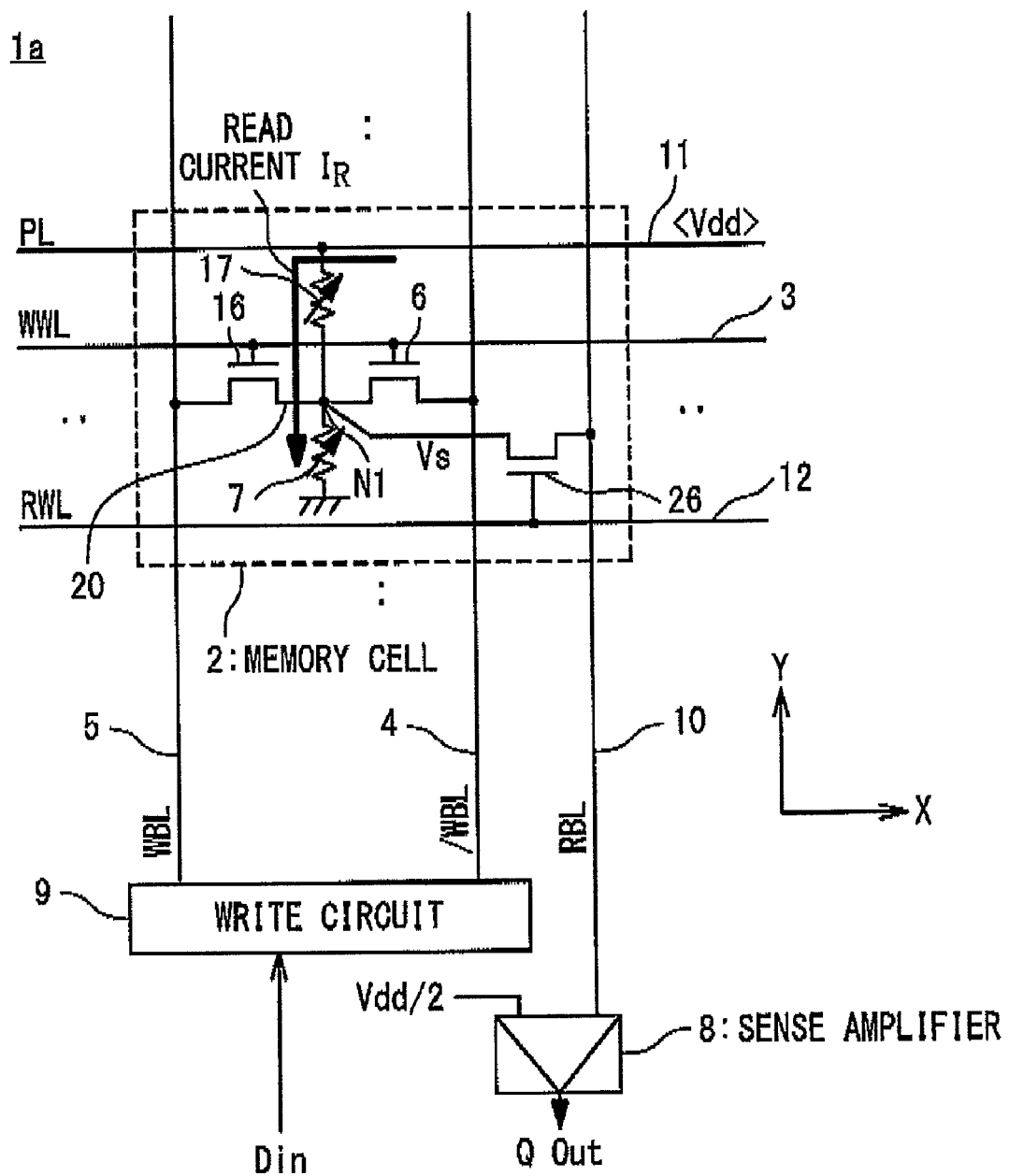
FIG. 7 is a circuit block diagram showing the configuration of the MRAM according to another exemplary embodiment of the present invention.

FIG. 7 is a circuit block diagram showing the configuration of the MRAM according to another exemplary embodiment of the present invention. An MRAM 1a contains a plurality of memory cells 2, a plurality of first bit lines (/WBL) 4, a plurality of second bit lines (WBL) 5, a plurality of third bit lines (RBL) 10, a plurality of first word lines (WWL) 3, a plurality of second word lines (RWL) 12, a plurality of plate lines (PL) 11, a write circuit 9 and a sense amplifier 8.

This exemplary embodiment differs from the exemplary embodiment shown in FIG. 5 in that a third transistor 26 is further provided for a read operation and write bit lines (the first bit line 4 and the second bit line 5) and a read bit line (a third bit line 10) are separated. Thus, the memory cell 2 in this exemplary embodiment is a 3T2MTJ cell (3-Transistor—2-MTJ Memory Cell). That is, the MRAM in this exemplary embodiment is configured as follows.

The first word line 3, the second word line 12 and the plate line 11 constitute a word line set and extend in the X-direction. The one ends of the first word line 3, the second word line 12 and the plate line 11 are connected to a decoder (not shown). The first bit line 4, the second bit line 5 and the plurality of third bit lines 10 constitute a bit line set and extend in the Y-direction. One ends of the first bit line 4 and the second bit line 5 are connected to the write circuit 9. The plurality of third bit lines 10 are connected to the sense amplifier 8.

The plurality of memory cells 2 are arranged in a matrix. The plurality of memory cells 2 are provided at intersections of the plurality of word line sets and the plurality of bit line sets. The write circuit 9 sends a write current Iw in a direction determined based on a write data Din to flow through a route of the first bit line 4—a selection cell 2—the second bit line 5, in a selection bit line set selected from among the plurality of bit line sets based on an address signal at the time of a write operation. Here, the selection cell 2 is the memory cell 2 selected from among the plurality of memory cells 2 by the selection bit line set and the selection word line set which is selected from the plurality of word line sets. The sense amplifier 8 compares a voltage of the selection third bit line 10 selected from the plurality of third bit lines 10 and a reference voltage Vdd/2 at the time of a read operation, and outputs the comparison result as the read data Qout.

The memory cell 2 contains a first transistor 6, a second transistor 16, a third transistor 26, a first MTJ element 7 and a second MTJ element 17. In the first transistor 6, its gate is connected to the first word line 3, one terminal is connected to the first bit line 4, and the other terminal is connected to the node N1. In the second transistor 16, its gate is connected to the first word line 3, one terminal is connected to the node N1, and the other terminal is connected to the second bit line 5. That is, the first transistor 6 and the second transistor 16 are connected in series between the first bit line 4 and the second bit line 5. Since the current flows through the write wiring 20 as a wiring through which the first transistor 6 and the second transistor 16 are connected, a data is written into the first MTJ element 7 and the second MTJ element 17. In the third transistor 26, its gate is connected to the second word line 12, one terminal is connected to the third bit line 10, and the other terminal is connected to the node N1. In the first MTJ element 7, one terminal is connected to the node N1 (the write wiring 20 between the first transistor 6 and the second transistor 16), and the other terminal is connected to the ground wiring. In the second MTJ element 17, one terminal is connected to the node N1, and the other terminal is connected to the plate line 11.

In the memory cell 2 (3T2MTJ cell), a load capacity of the third bit line 10 can be reduced, to allow the read operation to be performed at the speed higher than the memory cell in FIG. 5. Moreover, at the time of the read operation, the first transistor 6 and the second transistor 16 can be turned off, to allow the free degree of the circuit configuration in the sense amplifier 8 to be made high. Moreover, there is a merit that the write operation and the read operation to the memory cells 2 whose addresses are different can be performed at the same time.

The write operation of this memory cell 2 will be described below. At first, the decoder (not shown) grounds or opens the plate line 11 and the second word line 12. Thus, the third transistor 26 is turned off. Then, the decoder selects and activates the selection first word line 3 from the plurality of first word lines 3 in accordance with the address signal. Thus, the first transistor 6 and the second transistor 16 that are connected to the selection first word line 3 are turned on. On the other hand, the write circuit 9 selects the selection bit line set from the plurality of bit line sets in accordance with the address signal. Thus, the selection cell 2 is selected from the plurality of memory cells 2 by the selection first word line 3 and the selection bit line set. Then, the write circuit 9 sets one of the second bit line 15 and first bit line 14 of the selection bit line set to the power supply voltage (Vdd) and the other to the ground voltage (Gnd) in accordance with a write data Din. Thus, the write current Iw flows in one direction determined based on the write data Din through the write wiring 20 between the first transistor 6 and the second transistor 16 in the selection cell 2. Thus, the magnetic field for write, which results from the write current Iw, is generated around the write wiring 20. At this time, since the first MTJ element 7 and the second MTJ element 17 in the selection cell 2 are located near the write wiring 20, the write data Din is written with write magnetic field.

In the memory cell 2, the circuit is devised in such a manner that the write current Iw flows through only the selection cell 2. Thus, the margin for the write operation to the selection cell 2 can be made wide. Therefore, the write circuit can be simplified, to allow the write operation of the higher speed.

The read operation of the memory cell 2 will be described below. At first, the decoder (not shown) selects and activates the selection second word line 12 from the plurality of second word lines 12. Thus, the third transistor 26 is turned on. Also, the decoder selects the selection plate line 11 from the plurality of plate lines 11 and applies the power supply voltage (Vdd) to the selection plate line 11. Here, since the selection first word line 3 is not selected, both of the first transistor 6 and the second transistor 16 are turned off. At this time, the read current $I_R$ flows through a route of the plate line 11—the second MTJ element 17—the first MTJ element 7—the ground. As a result, the sense voltage Vs is generated at the node N1 at which the second MTJ element 17 and the first MTJ element 7 are connected, namely, on the write wiring 20. Here, since the second transistor 16 is turned on, the sense voltage Vs is outputted to the third bit line 10. The sense voltage Vs becomes the voltage higher or lower than Vdd/2 in accordance with the data stored in the second MTJ element 17 and the first MTJ element 7, as mentioned above. The sense amplifier 8 connected to the third bit line 10 compares the sense voltage Vs and the reference voltage (Vdd/2) and reads the stored data. Here, in order for the read current $I_R$ to flow through only the route of the second MTJ element 17 and the first MTJ element 7, it is preferable that the input impedance of the sense amplifier 8 is high.

In this way, the memory cell 2 performs the read operation by using the two MTJ elements (the first MTJ element 7 and the second MTJ element 17) for storing the complementary data. Thus, a read signal can be made large. That is, a read margin can be made wide. Moreover, since the read signal is voltage-based (the voltage sensing method), the sense amplifier for amplifying the signal can be miniaturized, and the read operation can be performed at the high speed.

Figure 8:
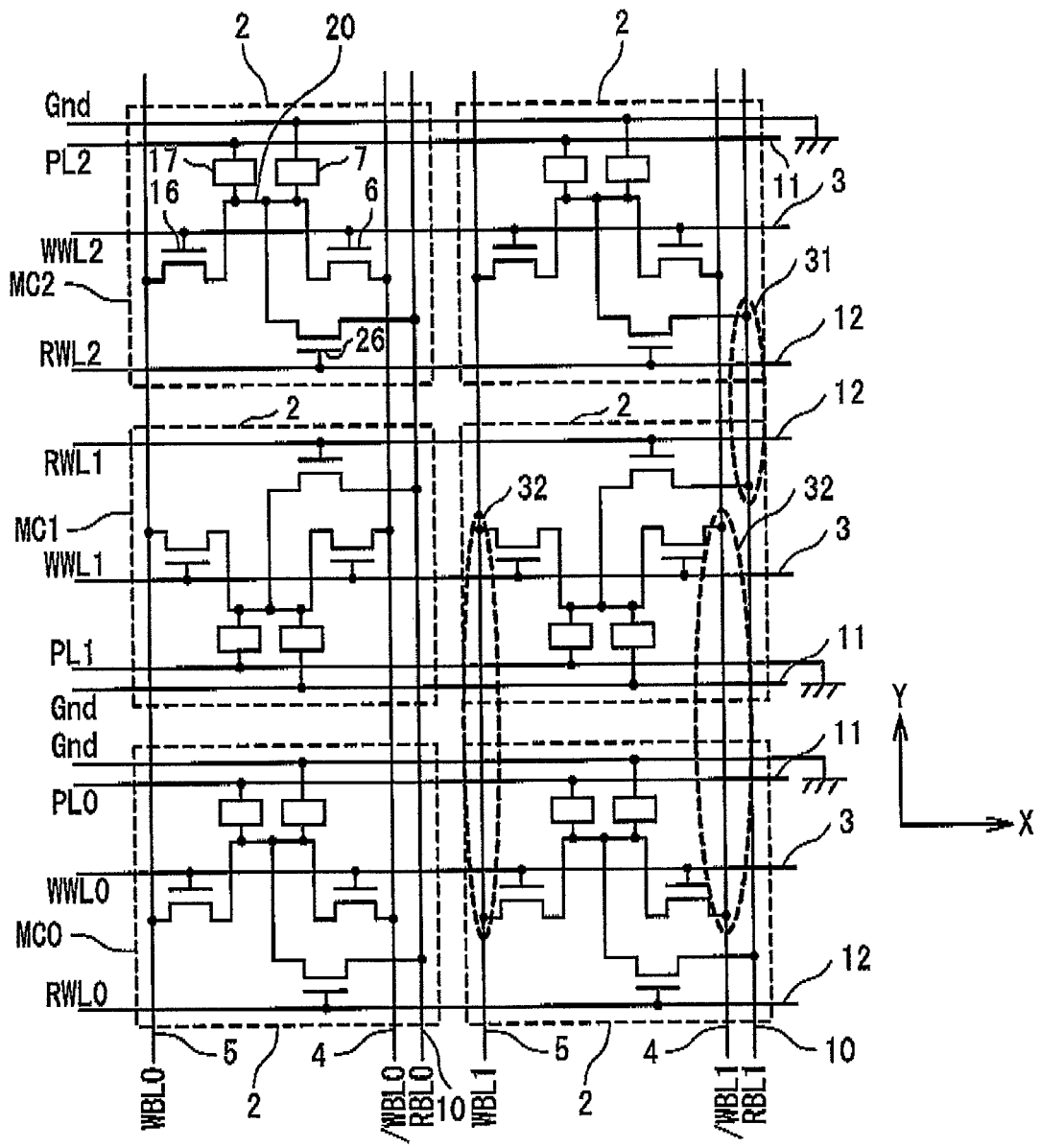
FIG. 8 is a circuit diagram showing a memory array in which memory cells shown in FIG. 7 are used.

FIG. 8 is a circuit diagram showing a memory array in which the memory cell shown in FIG. 7 is used. In FIG. 8, in order to easily check the drawing, only the plurality of first bit lines 4 (/WBL0, /WBL1, . . . ), the plurality of second bit lines 5 (WBL0, WBL1, . . . ), the plurality of third bit lines 10 (RBL0, RBL1, . . . ), the write wiring 20 (the wiring through which the first transistor 6 and the second transistor 16 are connected), the plurality of first word lines (WWL0, WWL1, WWL2, . . . ), the plurality of second word lies 12 (RWL0, RWL1, RWL2, . . . ), the plurality of plate lines 11 (PL0, PL1, PL2, . . . ), the ground wiring (Gnd), the first MTJ element 7 and the second MTJ element 17 are drawn.

Figure 9:
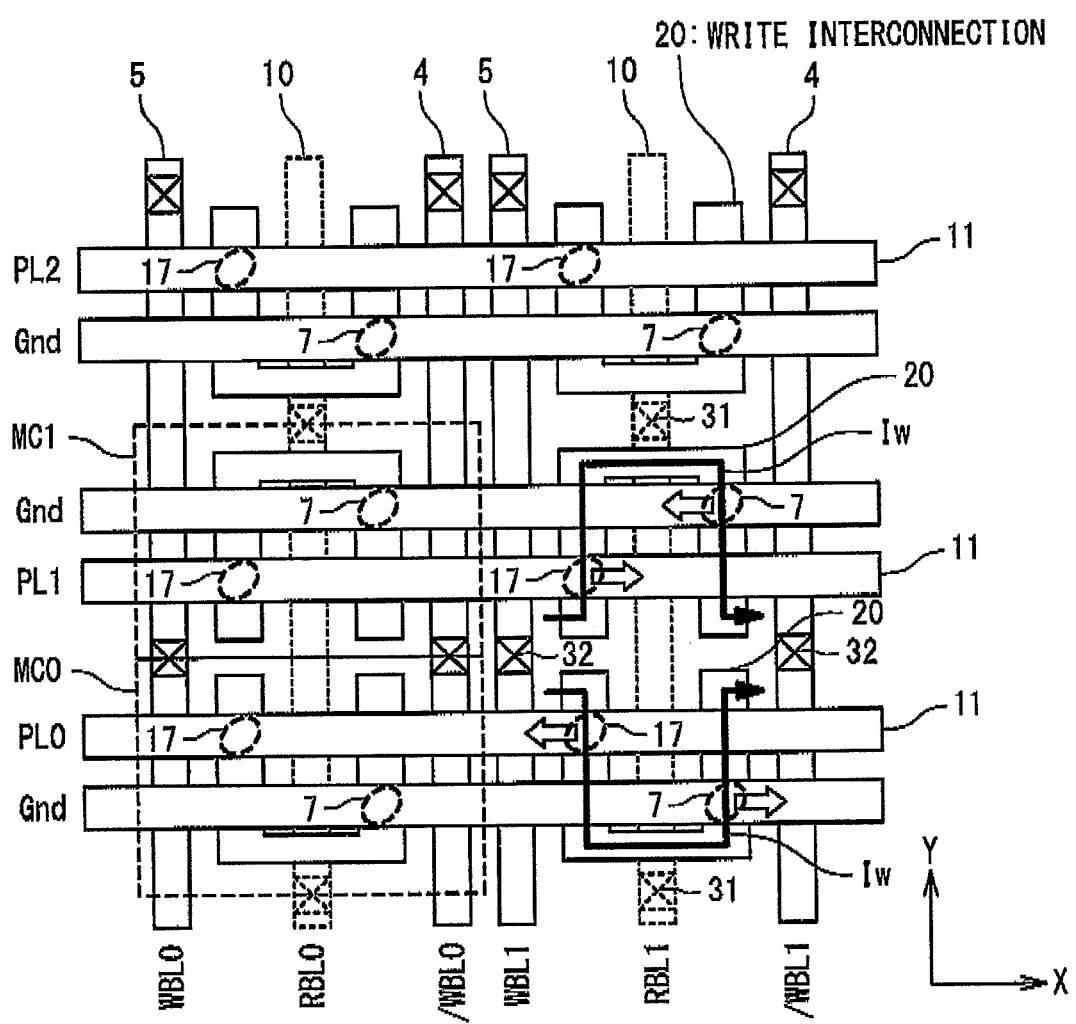
FIG. 9 is a plan view showing one example of a layout of the memory array shown in FIG. 8.

FIG. 9 is a plan view showing one example of a layout of the memory array in FIG. 8. In FIG. 9, in order to easily check the drawing, only the plurality of first bit lines 4 (/WBL0, /WBL1, . . . ), the plurality of second bit lines 5 (WBL0, WBL1, . . . ), the plurality of third bit lines 10 (RBL0, RBL1, . . . ), the write wiring 20 (the wiring through which the first transistor 6 and the second transistor 16 are connected), the plurality of plate lines 11 (PL0, PL1, PL2, . . . ), the ground wiring (Gnd), the first MTJ element 7 and the second MTJ element 17 are drawn. The directions of the solid-white arrows, which are shown on the first MTJ element 7 and the second MTJ element 17, indicate the directions of the magnetizations, which are generated by the write current Iw and applied to the free magnetic layer. In this example, the first MTJ element 7 and the second MTJ element 17 are laminated just on the layer of the write wiring 20. In order to write the complementary data into the first MTJ element 7 and second MTJ element 17, the layout is designed such that the write wiring 20 is substantially U-shaped, and the magnetization inversion magnetic fields resulting from the write currents Iw applied to the respective MTJ elements are devised to be opposite to each other.

The layouts in FIG. 6 and FIG. 9 are designed such that in order to reduce the area of the memory cell 2, diffusion layers and a via-hole layer of a transistor are shared between the memory cells physically adjacent to each other in the Y-direction, as shown by symbols 31 and 32. Thus, a memory cell 2_MC0 and a memory cell 2_MC1 are mirror-symmetrical. Here, the memory cell 2_MC0 is assumed to correspond to an even-numbered X-address, and the memory cell 2_MC1 is assumed to correspond to an odd-numbered X-address. At this time, the non-coincidence of the inversion magnetic fields is caused between the memory cell 2 of the even-numbered X-address and the memory cell 2 of the odd-numbered X-address. For example, when the write current Iw flows in a direction from the second bit line 5 to the first bit line 4, the inversion magnetic field is rightward applied to the first MTJ element 7, and the inversion magnetic field is leftward applied to the second MTJ element 17. On the other hand, the inversion magnetic field is leftward applied to the first MTJ element 7 in the memory cell 2_MC1, and the inversion magnetic field is rightward applied to the second MTJ element 17.

In order to avoid this non-coincidence, as one solving method, it is considered to change the direction of the write current Iw in accordance with the even-numbered or odd-numbered X-address. However, since the peripheral circuits such as the decoder, and the write circuit become relatively complicated, there is a possibility of the drop in the operation speed and the occurrence of the overhead of the circuit area. Also, as another solving method, it is considered to make the directions of the magnetizations of the pinned magnetic layers differ by 180° between the first MTJ element 7 and the second MTJ element 17. However, this is considered to be very difficult from the viewpoint of the manufacturing of the MTJ elements. Also, when the adjacent memory cells 2 are arranged in parallel, the foregoing problem does not occur. However, the overhead such as increase in the cell area is considered to occur.

Figure 10:
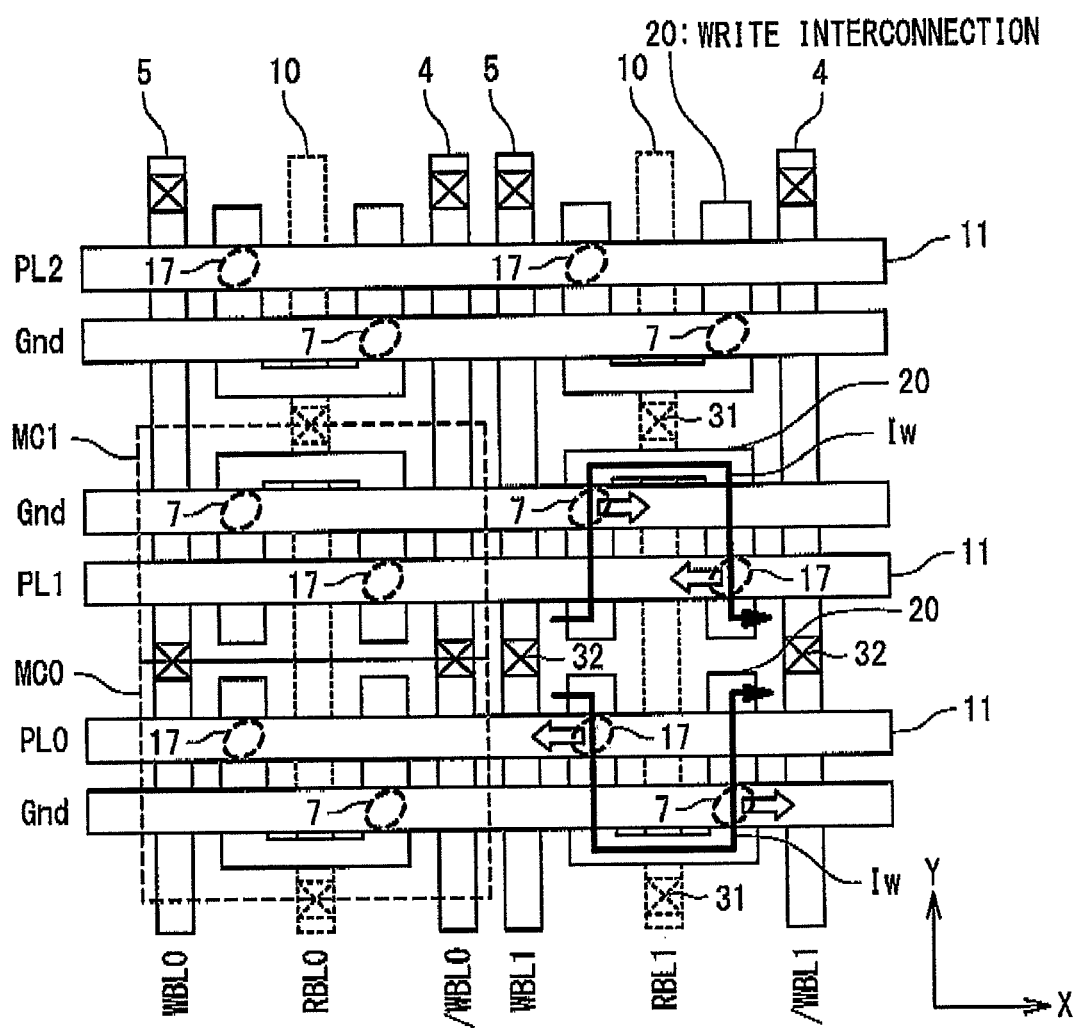
FIG. 10 is a plan view showing another example of the layout of the memory array shown in FIG. 8.

FIG. 10 is a plan view showing another example in the layout of the memory array in FIG. 8. Also in FIG. 9, in order to easily check the drawing, only the plurality of first bit lines 4 (/WBL0, /WBL1, . . . ), the plurality of second bit lines 5 (WBL0, WBL1, . . . ), the plurality of third bit lines 10 (RBL0, RBL1, . . . ), the write wiring 20 (the wiring through which the first transistor 6 and the second transistor 16 are connected), the plurality of plate lines 11 (PL0, PL1, PL2, . . . ), the ground wiring (Gnd), the first MTJ element 7 and the second MTJ element 17 are drawn. The directions of the solid-white arrows, which are shown on the first MTJ element 7 and the second MTJ element 17, indicate the directions of the magnetizations, which are generated by the write current Iw and applied to the free magnetic layer.

In order to reduce the area of the memory cell 2, the mirror arrangement is employed such that diffusion layers and a via-hole layer of a transistor can be shared between the memory cells physically adjacent to each other in the Y-direction, as shown by symbols 31 and 32. According to this layout, in order to prevent the write data Din from being not coincident with each other between the memory cell 2_MC0 and the memory cell 2_MC1, the layout of each MTJ element is devised. For example, in the memory cell 2_MC0 corresponding to the even-numbered X-address, the second MTJ element 17 is arranged on the side of the second bit line 5 and connected to the plate line 11, and the first MTJ element 7 is arranged on the side of the first bit line 4 and connected to the ground voltage (Gnd). On the contrary, in the memory cell 2_MC1 corresponding to the odd-numbered X-address, the first MTJ element 7 is arranged on the side of the second bit line 5 and connected to the ground voltage (Gnd), and the second MTJ element 17 is arranged on the side of the first bit line 4 and connected to the plate line 11. According to the layout, when the write current Iw flows from the second bit line 5 to the first bit line 4, the inversion magnetic field is applied to the right side of the first MTJ element 7 with respect to the drawing, and the inversion magnetic field is applied to the left side of the second MTJ element 17 with respect to the drawing, irrespectively of whether the X-address is the even-numbered X-address or odd-numbered X-address, Thus, the non-coincidence of the write data Din is not caused between the even-numbered and odd-numbered X-addresses. That is, the layout shown in FIG. 10 is further desirable, as compared with the layout shown in FIG. 9.

Figure 11:
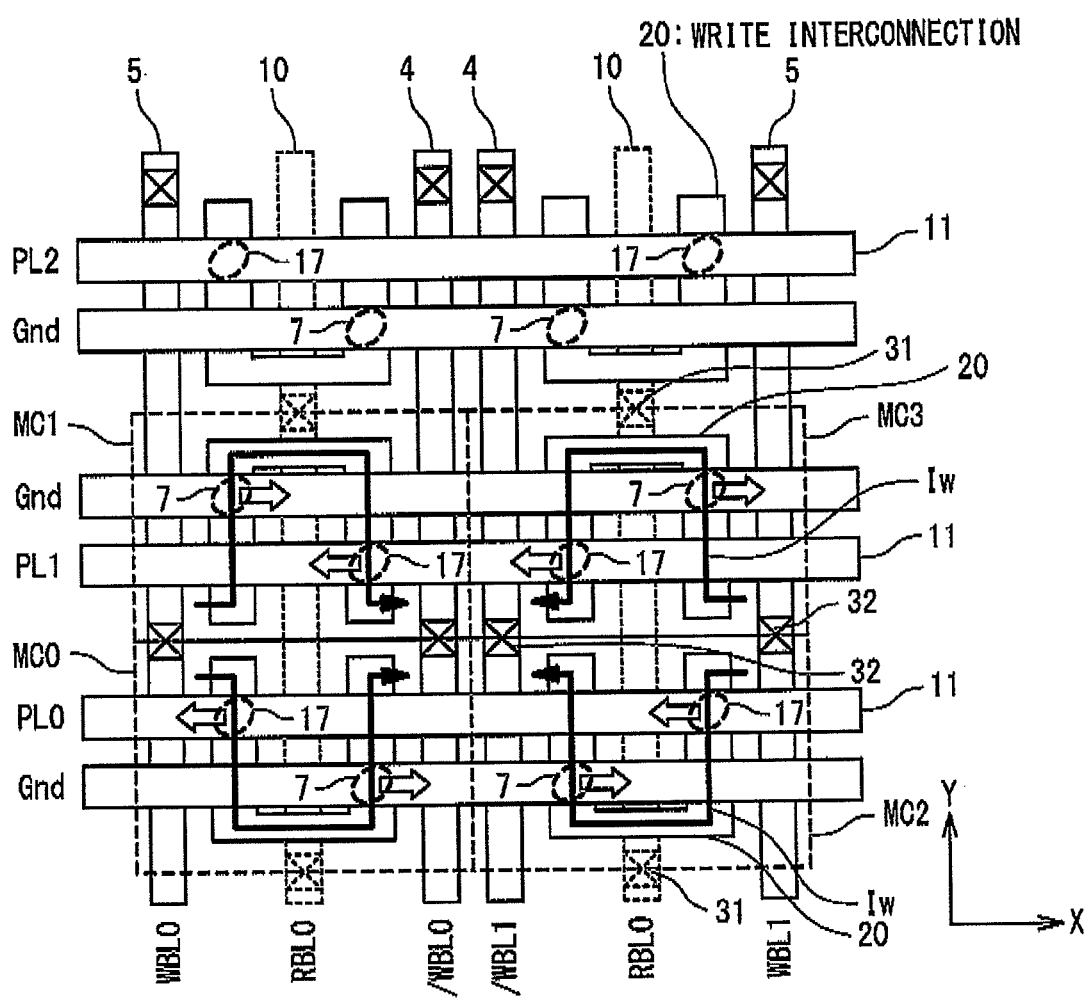
FIG. 11 is a plan view showing still another example of the layout of the memory array shown in FIG. 8.

FIG. 11 is a plan view showing still another example in a layout of the memory array shown in FIG. 8. Also, in FIG. 11, in order to easily check the drawing, only the plurality of first bit lines 4 (/WBL0, /WBL1, . . . ), the plurality of second bit lines 5 (WBL0, WBL1, . . . ), the plurality of third bit lines 10 (RBL0, RBL1, . . . ), the write wiring 20 (the wiring through which the first transistor 6 and the second transistor 16 are connected), the plurality of plate lines 11 (PL0, PL1, PL2, . . . ), the ground wiring (Gnd), the first MTJ element 7 and the second MTJ element 17 are drawn. The directions of the solid-white arrows, which are shown on the first MTJ element 7 and the second MTJ element 17, indicate the directions of the magnetizations, which are generated by the write current Iw and applied to the free magnetic layer.

In order to reduce the area of the memory cell 2, the mirror arrangement is employed not only between the memory cells physically adjacent to each other in the Y-direction, but also between the memory cells physically adjacent to each other in the X-direction, as shown by the symbols 31 and 32. According to the layout, similarly to the layout shown in FIG. 10, in order to prevent the write data Din from being not coincident with each other between the even-numbered and odd-numbered X-addresses, the layout of each MTJ element is devised. For example, in the memory cell 2_MC0 and the memory cell 2_MC2, the second MTJ element 17 is arranged on the side of the second bit line 5 and connected to the plate line 11, and the first MTJ element 7 is arranged on the side of the first bit line 4 and connected to the ground voltage (Gnd). On the contrary, in the memory cell 2_MC1 and the memory cell 2_MC3, the first MTJ element 7 is arranged on the side of the second bit line 5 and connected to the ground voltage (Gnd), and the second MTJ element 17 is arranged on the side of the first bit line 4 and connected to the plate line 11. According to the layout method, when the write current Iw flows from the second bit line 5 to the first bit line 4, the inversion magnetic field is applied to the right side of the first MTJ element 7 with respect to the drawing, and the inversion magnetic field is applied to the left side of the second MTJ element 17 with respect to the drawing, in all of the memory cells 2. Thus, the non-coincidence of the write data Din is not caused between the even-numbered and odd-numbered X-addresses and between the even-numbered and odd-numbered Y-addresses. That is, the layout shown in FIG. 11 is further desirable, as compared with the layout shown in FIG. 10.

As mentioned above, according to the configuration of this exemplary embodiment, it is possible to improve both of the write property and the read property, and it is possible to carry out the high speed operation whose cycle time is several ns.

Also, between the memory cells adjacent to each other, the layout except the MTJ elements is mirror-symmetry, and the MTJ elements are parallel-symmetrically arranged. Moreover, one of the features lies in that the arrangement positions of the first MTJ element 7 and the second MTJ element 17 are exchanged between the foregoing memory cells. Also, the present invention is not limited to the above-mentioned exemplary embodiments. For example, between the left and right memory cells adjacent to each other, the layout except the MTJ elements may be mirror-symmetry, and the MTJ elements may be parallel-symmetrically arranged.

The layouts shown in FIG. 9 to FIG. 11 can be similarly used even in the MRAM in the exemplary embodiment shown in FIG. 1. Even in such a case the effect similar to the above-mentioned effect can be attained.

As mentioned above, according to the memory cell based on the present invention, both of the write margin and the read margin can be improved, thereby enabling the high speed operation. Also, according to the layout method based on the present invention, the data can be matched between the adjacent memory cells, without any increase in the cell area and without any change in the circuit around the memory array.

The present invention is not limited to the above-mentioned exemplary embodiments. Clearly, the respective exemplary embodiments can be suitably changed within the range of the technical idea of the present invention.

The invention claimed is:

1. A magnetic random access memory comprising:
   a plurality of first wirings and a plurality of second wirings extending in a first direction;
   a plurality of third wirings and a plurality of fourth wirings extending in a second direction; and
   a plurality of memory cells arranged at intersections of said plurality of first wirings and said plurality of third wirings, respectively,
   wherein each of said plurality of memory cells comprises:
   a first transistor and a second transistor connected in series between a corresponding one of the plurality of first wirings and a corresponding one of the plurality of second wirings and controlled in response to a signal on a corresponding one of the plurality of third wirings,
   a first magnetic resistance element having one end connected to a write wiring through which said first transistor and said second transistor are connected, and the other end grounded, and
   a second magnetic resistance element having one end connected to said write wiring, and the other end connected to a corresponding one of said plurality of fourth wirings.

2. The magnetic random access memory according to claim 1, further comprising:
  a plurality of fifth wirings extending in the first direction; and
  a plurality of sixth wirings extending in the second direction,
  wherein each of said plurality of memory cells includes a third transistor connected between said write wiring and a corresponding one of said plurality of fifth wirings and controlled in response to a signal on a corresponding one of the plurality of sixth wirings.

3. The magnetic random access memory according to claim 1, wherein in two adjacent to each other among said plurality of memory cells, said write wirings are mirror-symmetrically arranged.

4. The magnetic random access memory according to claim 3, wherein in said two memory cells adjacent to each other, said write wirings are mirror-symmetrically arranged and said magnetic resistance elements are parallel-symmetrically arranged.

5. The magnetic random access memory according to claim 1, wherein different data are written into said first magnetic resistance element and said second magnetic resistance element in each of said plurality of memory cells based on a write current flowing through said write wiring.

6. The magnetic random access memory according to claim 1, wherein a node at which said corresponding first wiring and said first transistor are connected is physically shared by two adjacent to each other among said plurality of memory cells, and
  a node at which said corresponding second wiring and said second transistor are connected is physically shared by two memory cells adjacent to each other.

7. The magnetic random access memory according to claim 1, wherein in one of two memory cells adjacent to each other among said plurality of memory cells, said first magnetic resistance element is arranged on side of said corresponding first wiring, and said second magnetic resistance element is arranged on a side of said corresponding second wiring, and in the other memory cell, said first magnetic resistance element is arranged on a side of said corresponding second wiring, and said second magnetic resistance element is arranged on a side of said corresponding first wiring.

8. The magnetic random access memory according to claim 1, wherein said write wiring is substantially U-shaped.

9. An operation method of a magnetic random access memory, comprising:
  a plurality of first wirings and a plurality of second wirings extending in a first direction;
  a plurality of third wirings and a plurality of fourth wirings extending in a second direction; and
  a plurality of memory cells arranged at intersections of said plurality of first wirings and said plurality of third wirings, respectively,
    wherein each of said plurality of memory cells comprises:
  a first transistor and a second transistor connected in series between a corresponding one of said plurality of first wirings and a corresponding one of said plurality of second wirings and controlled in response to a signal on a corresponding one of said plurality of third wirings,
  a first magnetic resistance element having one end connected to a write wiring through which said first transistor and said second transistor are connected, and the other end grounded; and
  a second magnetic resistance element having one end connected to said write wiring, and the other end connected to the fourth wiring,
  wherein said operation method at a time of a read operation from the memory cell, comprises:
  (A) setting a corresponding one of said plurality of fourth wirings to a first voltage higher than a ground voltage, and
  (B) outputting a read data based on a comparison result between a voltage of said write wiring and ½ of the first voltage as a reference voltage.

10. The operation method according to claim 9, wherein said (B) comprises:
  (B1) selecting said corresponding third wiring to turn on said first transistor and said second transistor; and
  (B2) obtaining the voltage of said write wiring from one of said corresponding first wiring and said corresponding second wiring.

11. The operation method according to claim 9, wherein said magnetic random access memory further comprises:
  a plurality of fifth wirings extending in the first direction; and
  a plurality of sixth wirings extending in the second direction,
  wherein each of said plurality of memory cells comprises a third transistor connected between said write wiring and a corresponding one of said plurality of fifth wirings and controlled in response to a signal on a corresponding one of said plurality of sixth wirings,
  wherein said (B) comprises:
  (B1) selecting said corresponding sixth wiring to turn on said third transistor; and
  (B2) obtaining the voltage of said write wiring from the fifth wiring.

* * * * *